United States Patent
Kim et al.

(10) Patent No.: US 8,024,545 B2
(45) Date of Patent: Sep. 20, 2011

(54) EFFICIENT PREFETCHING AND ASYNCHRONOUS WRITING FOR FLASH MEMORY

(75) Inventors: Deok-Hwan Kim, Seoul (KR); Kwang-Hee Park, Seoul (KR)

(73) Assignees: Inha-Industry Partnership Institute, Incheon (KR); Electronics and Telecommunications Research Inst., Daejeon (KR)

( * ) Notice: Subject to any disclaimer, the term of this patent is extended or adjusted under 35 U.S.C. 154(b) by 396 days.

(21) Appl. No.: 12/254,410

(22) Filed: Oct. 20, 2008

(65) Prior Publication Data

US 2009/0106486 A1 Apr. 23, 2009

(30) Foreign Application Priority Data

Oct. 19, 2007 (KR) .................... 10-2007-0105639
Jun. 12, 2008 (KR) .................... 10-2008-0055289

(51) Int. Cl.
*G06F 12/10* (2006.01)
(52) U.S. Cl. .. 711/206; 711/103; 711/156; 711/E12.058
(58) Field of Classification Search ............ None
See application file for complete search history.

(56) References Cited

U.S. PATENT DOCUMENTS

| | | | |
|---|---|---|---|
| 5,404,485 A | 4/1995 | Ban | |
| 5,937,425 A | 8/1999 | Ban | |
| 5,963,984 A * | 10/1999 | Garibay et al. | 711/206 |
| 6,732,221 B2 | 5/2004 | Ban | |
| 2006/0136696 A1* | 6/2006 | Grayson | 711/206 |
| 2007/0038808 A1* | 2/2007 | Yim et al. | 711/120 |

OTHER PUBLICATIONS

Li-Pin Chang, Tei-Wei Kuo, "An Efficient Management Scheme for Large-scale Flash-memory Storage Systems" Proceedings of the 2004 ACM symposium on Applied computing, Mar. 14-17, 2004, ACM, pp. 862-868.*
Chin-Hsien Wu, et al., "A space efficient caching mechanism for flash memory address translation" Ninth IEEE International Symposium on Object and Component-Oriented Real-Time Distributed Computing, Apr. 24-26, 2006, IEEE, 1-8.*
Jesung Kim, et al., "A space-efficient flash translation layer for CompactFlash systems" IEEE Transactions on Consumer Electronics, May 2002, IEEE, vol. 48 issue 2, 366-375.*
Chin-Hsien Wu, et al., "An Adaptive Two-Level Management for the Flash Translation Layer in Embedded Systems" ICCAD'06 Nov. 5-9, 2006, San Jose, CA.

* cited by examiner

*Primary Examiner* — Matt Kim
*Assistant Examiner* — Ralph A Verderamo, III
(74) *Attorney, Agent, or Firm* — H.C. Park & Associates, PLC

(57) ABSTRACT

Disclosed herein are a flash file system and an address translation method. The flash file system includes a file system, a Flash Translation Layer (FTL), and flash memory. The FTL receives Local Block Addresses (LBAs) from the file system, and translates the LBAs into Physical Block Address (PBAs. The flash memory receives the resulting PBAs. The FTL includes a memory block in which a multi-stage clustered hash table for mapping the LBAs to the PBAs is stored, and performs the address translation using the clustered hash table.

13 Claims, 6 Drawing Sheets

EFFICIENT PREFETCHING AND ASYNCHRONOUS WRITING FOR FLASH MEMORY

CROSS REFERENCE TO RELATED APPLICATIONS

This application claims priority to and the benefit of Korean Patent Application No. 10-2007-0105639, filed on Oct. 19, 2007, and Korean Patent Application No. 10-2008-0055289, filed on Jun. 12, 2008, which are both incorporated by reference for all purposes as if fully set forth herein.

BACKGROUND OF THE INVENTION

1. Field of the Invention

The present invention relates generally to a flash file system, and, more particularly, to a Flash Translation Layer (FTL) for intermediating between flash memory and an existing file system, and an address translation method using the FTL.

The present invention is the result of the work which was sponsored by MIC/IITA/ETRI SoC Industry Promotion Center, Human Resource Development Project for IT SoC Architect and the Ministry of Knowledge Economy (MKE) and Korea Industrial Technology Foundation (KOTEF) through the Human Resource Training Project for Strategic Technology 2. Description of the Related Art Recently, with the commercialization of mass NAND flash memory, the NAND flash memory is attracting attention as new storage devices that will replace magnetic disks in the future. NAND flash memory is advantageous in that it has high input and output speeds because it can make random access, unlike typical hard disks, and it is useful for embedded systems and industrial systems because it is robust against outsider impact. Meanwhile, NAND flash memory has physical characteristics different from those of magnetic disks in addition to the above advantages.

First, NAND flash memory includes pages (512 B or 2 KB) and blocks (16 KB or 128 KB). A page is a minimum unit of NAND flash memory, and 32 or 64 pages generally constitute one block. Second, each of the blocks has a limitation on the number of updates, which is called wear. For example, a Single Level Cell (SLC) has a lifespan corresponding to about a hundred thousand updates, whereas a Multi Level Cell (MLC) has a lifespan corresponding to about ten thousand updates. Third, NAND flash memory is subjected to three operations, that is, read, write and erase operations. The read and write operations are performed on a page basis (512 B or 2 KB), whereas the erase operation is performed on a block basis (16 KB or 128 KB). Fourth, since block-based erase speed is the speed of the erasion of many pages of a block, it is considerably slower than read or write speed.

Meanwhile, since an existing hard disk-dedicated file system is designed regardless of the above-described characteristics of NAND flash memory, the intervention of a Flash Translation Layer (FTL), which is middleware, is required for achieving compatibility between the existing file system and NAND flash memory. The functions of the FTL will be described below.

First, in order to perform in-place update used in the existing file system, an erase-before-write operation must be performed. However, in flash memory, an erase operation is performed on a block basis, so that the cost of erasion is very high. Accordingly, NAND flash memory performs out-place update instead of in-place update, and the FTL performs this out-place update. Second, since NAND flash memory has a specific lifespan, the FTL functions to level the wear over all blocks so that the flash memory can be used for a long time. Third, since erase speed is slower than read or write speed, a garbage collection function of collectively erasing the invalid blocks of flash memory is included.

Meanwhile, the FTL generally uses a page-based address translation technique, but has a problem in that the size of its address translation table is large. In order to overcome this problem, the NAND Flash Translation Layer (NFTL) scheme, which is a block-based address translation scheme, is used. In the NFTL scheme, the quotient obtained by dividing the value of a Logical Block Address (LBA) by the number of pages per block is used as a Virtual Block Address (VBA), and the remainder is used as an offset. Meanwhile, when the address translation table is accessed, an entry having the addresses of a primary block and a replacement block is accessed through the value of the VBA. However, since the NFTL scheme is a block-based translation scheme, replacement blocks must be sequentially searched again if the searching of a primary block for an address fails, with the result that there are defects in that the performance of address translation is low and overhead attributable to address translation is large.

Furthermore, another example of the address translation scheme is the Adaptive Flash Translation Layer (AFTL) scheme. The AFTL uses two-level address translation tables, that is, a coarse-grained hash table, which is a block-based address translation table, and a fine-grained hash table, which is a page-based address translation table. However, the AFTL scheme has a problem in that the amount of memory used is large because tags and points are additionally required.

Moreover, the hash table used in the above-described NFTL scheme and the AFTL scheme has a problem in that about 200% overhead occurs in the amount of memory used because flexibility is lacking due to fixed address translation speed and a tag and a next pointer are additionally required for each node.

SUMMARY OF THE INVENTION

Accordingly, the present invention has been made keeping in mind the above problems occurring in the prior art, and an object of the present invention is to provide a flash file system that is capable of minimizing the size of address translation tables, maximizing the performance of address translation and leveling the wear of flash memory using clustered hash tables, bucket-based address management, the prefetching of similar addresses in the case of address translation and an asynchronous write technique, and an address translation method using an FTL.

In order to accomplish the above object, the present invention provides a flash file system, including a file system; a Flash Translation Layer (FTL) for receiving Local Block Addresses (LBAs) from the file system, and translating the LBAs into Physical Block Address (PBAs); and flash memory for receiving the resulting PBAs; wherein the FTL includes a memory block in which a multi-stage clustered hash table for mapping the LBAs to the PBAs is stored, and performs the address translation using the clustered hash table.

The clustered hash table stored in the memory block may include first and second clustered hash tables of a page translation type and a third clustered hash table of a block translation type, each of the clustered hash tables including buckets into each of which a predetermined number of pieces of consecutive address data is grouped.

Each of the page translation-type clustered hash tables may include buckets into each of which a predetermined number of consecutive LBAs is grouped, and the block translation-type clustered hash table may include buckets into each of which a predetermined number of consecutive sub-blocks is grouped.

The block translation-type clustered hash table may include continuity counter, each indicative of a number of consecutive sub-blocks, along with PBAs of the sub-blocks.

If the entered LBA exists in the clustered hash table, the FTL may prefetch an entire bucket including the LBA to the memory block and then performs the address translation.

Each of the LBAs recorded in each of the page translation-type clustered hash tables may include a bit vector that includes a reference bit and a modification bit respectively indicative of reference and modification of the LBA, and address data recorded in each of the tables may be migrated from the first clustered hash table to the third clustered hash table and from the second clustered hash table to the third clustered hash table on a basis of the bit vectors.

Each of the memory blocks may include a buffer, data stored in the flash memory at the address may be temporarily stored in a buffer if a reference bit of a bit vector at an address for which a write operation is requested is 1, then data stored in the buffer may be collectively written to the flash memory if the buffer becomes full or the reference bit is changed to 0.

Each of the LBAs recorded in each of the first and the second clustered hash tables may include the data of a hit count in which the number of uses of the LBA is recorded, and the hit count of address data stored in each of the clustered hash tables may be compared with a preset threshold value and then the address data is migrated based on the result of the comparison.

Additionally, in order to accomplish the above object, the present invention provides an address translation method using a Clustered Flash Translation Layer (CFTL), including the steps of (a) searching a page translation-type first clustered hash table for an LBA, translation of which has been requested; (b) determining whether data corresponding to the LBA exists in the first clustered hash table, and, if the data exists, translating the LBA into a PBA; (c) If, as a result of the determination at step (b), the data of the LBA does not exist, determination whether the data of the LBA exists in a page translation-type second clustered hash table, and, if the data exists, translating the LBA into a PBA; and (d) if, as a result of the determination at step (c), the data of the LBA does not exist, translating the LBA into a PBA using a block translation-type third clustered hash table.

The data of each address recorded in the third clustered hash table may include a hit count in which a number of uses of the address is recorded, and the address translation method may further include, after step (d), step (e) of, if the hit count exceeds a first preset threshold value, migrating the data of the address from the third clustered hash table to the second clustered hash table.

The data of each address recorded in the second clustered hash table may include a hit count in which a number of uses of the address is recorded, and the address translation method may further include, after step (d), step (f) of, if the hit count exceeds a second preset threshold value, migrating the data of the address from the second clustered hash table to the first clustered hash table.

The address translation method may further include, after step (d), step (g) of migrating data of each address recorded in the first clustered hash table or the second clustered hash table, from the first clustered hash table or the second clustered hash table to the third clustered hash table using a bit vector including a reference bit indicative of reference of the address and a modification bit indicative of modification of the address.

Each of the clustered hash tables may include buckets into each of which a predetermined number of consecutive sub-blocks, including data of the LBAs or VBAs, is grouped.

The third clustered hash table may include continuity counters, each indicative of a number of consecutive sub-blocks, along with PBAs of the sub-blocks.

If the LBA, the translation of which has been requested, exists in the clustered hash table, the address translation may be performed after an entire bucket including the LBA has been prefetched to the memory block.

BREIF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Reference now should be made to the drawings, in which the same reference numerals are used throughout the different drawings to designate the same or similar components.

A flash file system and address translation method using an FTL according to the present invention will be described with reference to the accompanying drawings below.

Figure 1:
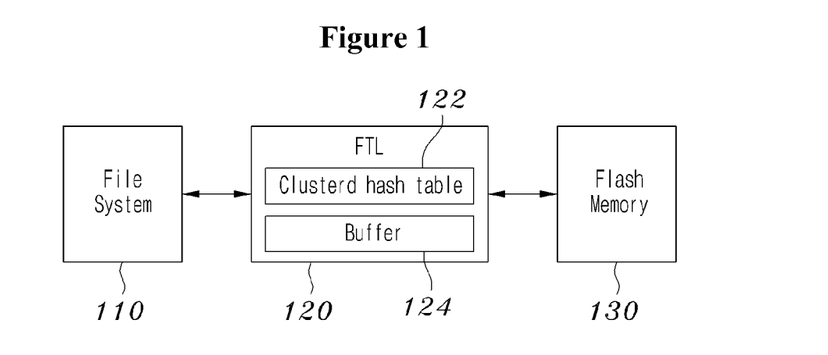
FIG. 1 is a schematic block diagram showing a flash file system according to an embodiment of the present invention.

FIG. 1 is a block diagram schematically showing a flash file system according to an embodiment of the present invention.

Referring to FIG. 1, the flash file system of the present invention includes a file system 110 used for magnetic disks and the like, an FTL 120 for receiving Logical Block Addresses (LBAs) from the file system 110 and converting the LBAs into Physical Block Addresses (PBAs), and flash memory 130.

The FTL 120 of the present invention has an address mapping table for mapping LBAs to PBAs, and performs address translation using a clustered hash table 122. Address translation methods are classified into a page mapping method (using a fine-grained hash table) and a block mapping method (using a coarse-grained hash table) according to the mapping unit. A page mapping method is disadvantageous in that the size of a table is large, but is advantageous in that the efficiency of address translation is high. The block mapping method is advantageous in that the size of a table is small, but is disadvantageous in that the efficiency of address translation is low.

The clustered hash table of the present invention includes a combination of a page mapping-type table and a block mapping-type table, and performs address translation using clustered hash tables in which hash tables are combined with the advantages of linear tables. That is, each of the hash tables includes buckets into each of which consecutive pieces of address data are grouped. The clustered hash table of the present invention reduces the amount of memory used by tags and pointers and improves the performance of address translation using the buckets.

Furthermore, the multi-stage clustered hash table of the present invention reduces miss penalty during address translation by constructing a two-stage page mapping-type table, and improves the efficiency of address translation by reducing address translation based on a block-based hash table having a great address translation overhead. Moreover, the multi-stage clustered hash table of the present invention improves the performance of continuous address translation using a continuity counter and prefetching, and improves the lifespan and performance of flash memory using write delay based on the 2-bit access prediction technique.

Figure 2:
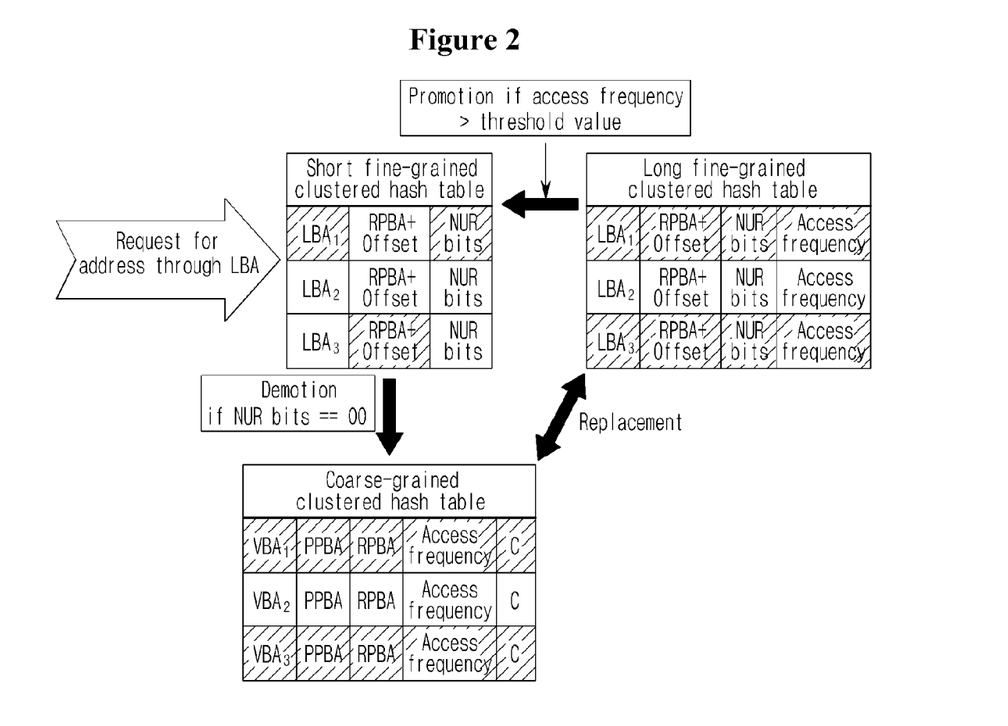
FIG. 2 is a schematic diagram of a clustered FTL according to an embodiment of the present invention.
Figure 3:
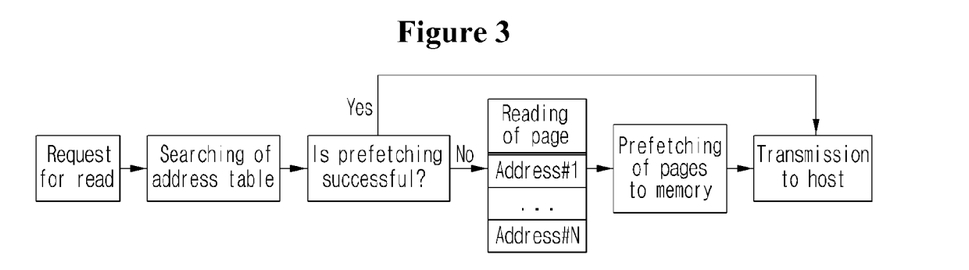
FIG. 3 is a flowchart showing the prefetching procedure of an FTL according to an embodiment of the present invention.

FIG. 2 is a schematic diagram of a CFTL according to an embodiment of the present invention, and FIG. 3 is a flowchart showing a prefetching procedure for an FTL using a CFTL scheme.

As shown in FIG. 2, a clustered hash table utilizes a combination of a linear table technique and a hash table technique. The clustered hash table includes a short fine-grained clustered hash table for grouping similar addresses into the same bucket, a long fine-grained clustered hash table for, using a cache such as a Translation Lookaside Buffer (TLB), minimizing miss penalty and reducing the frequency of access to a coarse-grained clustered hash table, which causes address translation to have a high overhead, and a coarse-grained clustered hash table for reducing the burden of address translation by using a continuity counter in response to the consecutive requests for the address translation of LBAs.

Based on the above-described construction, when address translation is requested and if a requested LBA exists in the fine-grained clustered hash table, the entire page of a bucket to which the LBA belongs is prefetched and then address translation is performed, thereby improving the performance of address translation.

Here, the short fine-grained clustered hash table utilizes a combination of a linear table technique and a hash table technique. The short fine-grained clustered hash table uses a smaller amount of memory than an existing hash table, and causes similar addresses to be grouped into the same bucket, thereby ensuring locality.

Accordingly, when a request for the address translation of a specific LBA is received from a host, the short fine-grained clustered hash table is first searched, and the address translation is terminated if a matching PBA is found. In contrast, if a matching PBA is not found in the short fine-grained clustered hash table, the long fine-grained clustered hash table is searched, and the address translation is terminated if a matching PBA is found.

Meanwhile, if a matching PBA is not also found in the long fine-grained clustered hash table, the coarse-grained clustered hash table is finally searched for matching address translation information. The coarse-grained clustered hash table translates an LBA into a VBA and an offset in the same way as in the NFTL scheme. A bucket in which a Primary Physical Block Address (PPBA) and a Replacement Physical Block Address (RPBA) have been stored is searched for by hashing the VBA that is obtained as described above. Meanwhile, if page data existing in a matching PPBA and offset is invalid, RPBAs are sequentially searched for the relevant PBA.

Furthermore, the above-described long fine-grained clustered hash table requires the migration for a coarse-to-fine switch and a fine-to-coarse switch, and promotion and demotion policies are used as the policies therefor. That is, in the case of a coarse-to-fine switch, a promotion policy of performing promotion to the long fine-grained clustered hash table may be used first if the frequency of access is increased by a predetermined value due to frequent access to a specific LBA, or a demotion policy of performing demotion from the fine-grained clustered hash table to the coarse-grained clustered hash table may be used through the Not Recently Used (NUR) technique if access has not been made for a predetermined period of time. Meanwhile, after the promotion policy has been performed, the frequency of access is initialized, and the above policies are applied to the short fine-grained clustered hash table in the same manner.

Accordingly, using the long fine-grained clustered hash table, the miss penalty can be reduced and the frequency of access to the coarse-grained clustered hash table can be decreased. Furthermore, since most address translation is performed in the fine-grained clustered hash table, address translation time can be reduced.

The above-described NUR technique is a method capable of periodically determining slots not recently used in a system using bit vectors called a reference bit and a modification bit. Accordingly, reference status and modification are determined based on two bits, and determination results are applied to the fine-to-coarse replacement technique, as shown in Table 1.

TABLE 1

| Reference bit | Modification bit | Policy |
| --- | --- | --- |
| 0 | 0 | demoted to coarse |
| 0 | 1 | maintained |
| 1 | 0 | maintained |
| 1 | 1 | maintained |

That is, as shown in Table 1, if the reference and modification bits of a specific NUR address are all 0, it is determined that the address has not been used recently, the migration from the fine-grained clustered hash table to the coarse-grained clustered hash table is performed, and the slot of the fine-grained clustered hash table is deleted.

Meanwhile, a method of prefetching the pages of PBAs pointed to by the sub-blocks of a specific bucket of the clustered hash table shown in FIG. 3 will be descried below.

Unlike a generally used technique in which whenever an LBA is requested, an FTL translates an address and transmits data, a prefetching technique for consecutive pages according to the present invention prefetches pages having consecutive LBAs in a single bucket of the fine-grained clustered hash table.

That is, in the clustered hash table, which is a data structure used in the address translation technique, consecutive LBAs and their corresponding PBAs are stored in the same bucket. When the reading of the LBAs of a specific bucket is requested, the physical pages of adjacent sub-blocks can be prefetched. Accordingly, repetitive memory loading and the issuance of an instruction to flash memory every time can be prevented, the read time can be reduced for the next read operation because a plurality of pages have been prefetched.

Figure 4:
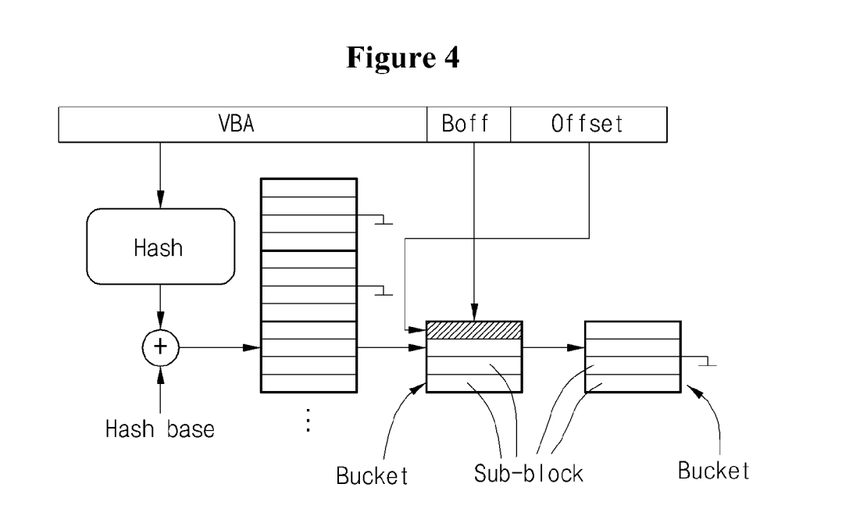
FIG. 4 is a diagram showing a clustered hash table according to an embodiment of the present invention.

Here, the number of sub-blocks of a single bucket is referred to as a sub-block factor. Since the clustered hash table has a plurality of sub-blocks in a single bucket, unlike a typical hash table, the clustered hash table is characterized in that the amount of memory used by a pointer per address can be reduced by the quantity of 1 divided by the sub-block factor.

Accordingly, since in the clustered hash table, a plurality of pieces of consecutive data simultaneously used are consecutively stored in the sub-blocks of a bucket, the clustered hash table is very useful for maintaining locality in an address translation table, and is used as an address translation data structure in the present invention.

Meanwhile, in the present invention, a continuity counter is added to each sub-block of each bucket of the above-described coarse-grained clustered hash table. In the case where Virtual Block Addresses (VBAs) and Physical Block Addresses (PBAs) are consecutive, the number of consecutive blocks is entered as the value of the continuity counter. Through this, PBAs can be acquired and address translation can be performed without repetition of the address translation mechanism. As a result, since the fine-grained clustered hash table is configured such that LBAs having high access frequencies are arranged in an independent table, the fine-grained clustered hash table improves the performance of address translation by reducing address searching time, and further improves the performance of address translation by prefetching data at PBAs pointed to by the sub-blocks of a relevant bucket to primary memory.

Here, the above-described continuity counter, that is, a continuity counter used in the address translation method in case of requests for the address translation of consecutive LBAs, is value 'C' that is stored in each sub-block in the coarse-grained clustered hash table. In the case where VBAs are consecutive and physical blocks are also consecutive, the number of consecutive blocks is entered in the continuity counter, through which address translation is enabled without the repetition of the address translation mechanism. For example, when the VBA is 128, the PPBA is 386, the continuity counter is 8 and the increment value of the VBA is equal to or less than 8, the value of a PPBA can be acquired without the use of address translation.

Figure 6:
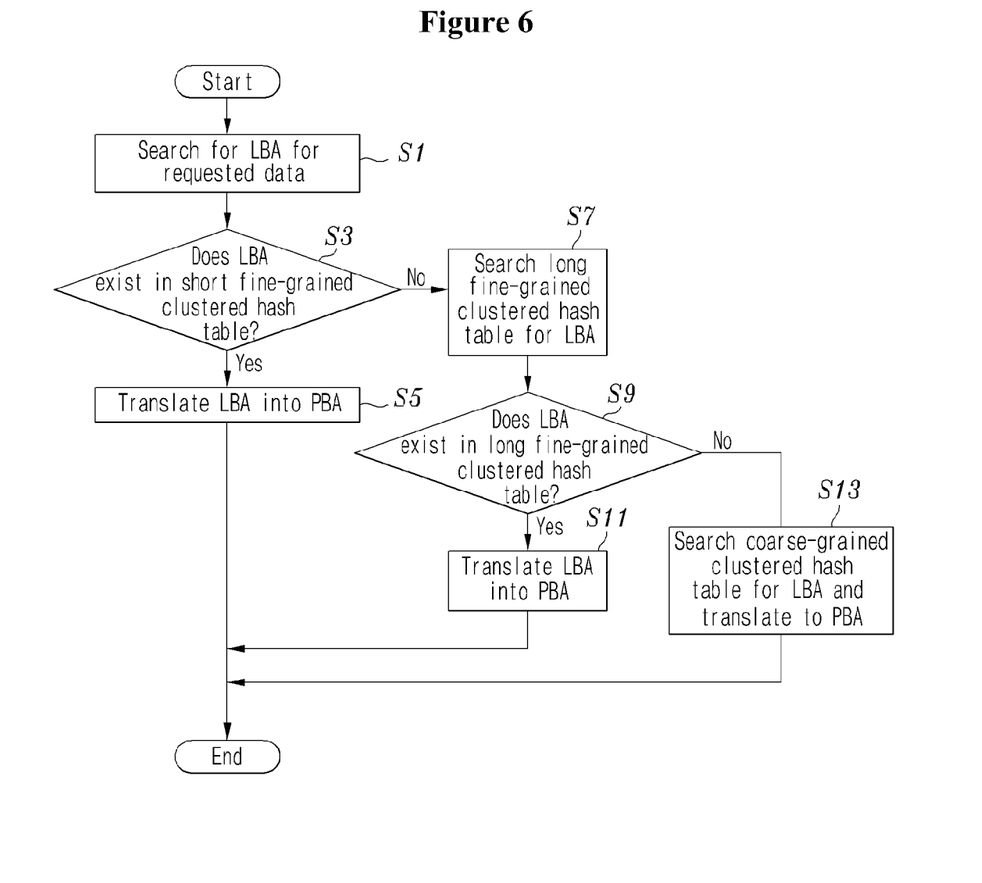
FIG. 6 is a flowchart showing an address translation method using a CFTL according to an embodiment of the present invention.

FIG. 6 is the entire flowchart showing an address translation method using a clustered FTL according to a preferred embodiment of the present invention.

As shown in FIG. 6, the short fine-grained clustered hash table 11 searches for a specific LBA for requested data at step S1.

Thereafter, it is determined based on the result of the searching at step S1 whether the specific LBA exists in the short fine-grained clustered hash table 11 at step S3.

Finally, if, as a result of the determination at step S3, the specific LBA exists, the LBA is translated into a PBA and then the procedure is terminated at step S5.

If, as a result of the determination at step S3, the specific LBA does not exist, the specific LBA for the requested data is searched for using the long fine-grained clustered hash table 12 at step S7.

Thereafter, it is determined based on the result of the searching at step S7 whether the specific LBA exists in the long fine-grained clustered hash table 12 at step S9.

Finally, if, as a result of the determination at step S9, the specific LBA exists, the LBA is translated into a PBA and then the procedure is terminated at step S11.

If, as a result of the determination at step S9, the specific LBA does not exist, the specific LBA for the requested data is searched for, the LBA is translated into a VBA using the coarse-grained clustered hash table 13, a PPBA and an RPBA are searched for, and the translation of an address is performed at step S13.

Figure 7:
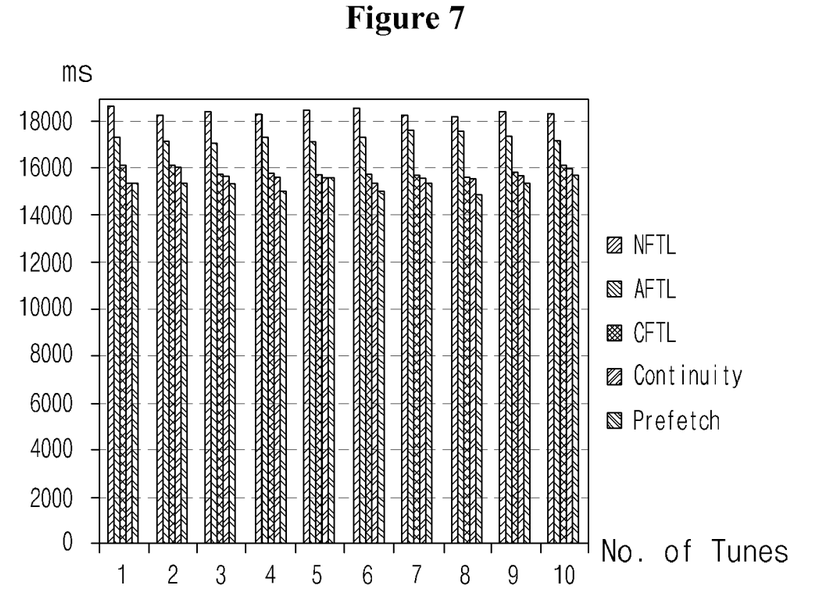
FIGS. 7, 8, 9 and 10 are graphs comparing the performance of address translation, the number of writes and write time in a flash file system according to an embodiment of the present invention with those of the prior art.

FIG. 7 is a graph comparing the performance of a CFTL according to the present invention with the performance of an NFTL and an AFTL. The experiments were conducted using the Memory Technology Device (MTD) of the LINUX kernel 2.6.17 environment. In order to evaluate the performance, the ratio of the slots of a short fine-grained clustered hash table to the slots of a long fine-grained clustered hash table was set to 1:4. For example, this means that, if the number of Maximum Short Fine-grained Slots (MSFSs) is 1000, the number of Maximum Long Fine-grained Slots (MLFSs) is 4000. For the experiments, the sub-block factor of a clustered hash table, that is, the number of sub-blocks, was set to 8, the number of MSFSs was set to 2500, and the number of MLFSs was set to 10,000. The numbers of slots of the prediction table of a 2-bit write prediction technique were set to 1024, 2048 and 4096.

Here, in order to measure address translation time and the entire performance of an FTL, the Andrew benchmark, a well known as a benchmark for the performance of storage devices, was used. The Andrew benchmark is executed in five steps: 1) directory creation, 2) data copy, 3) recursive file searching, 4) file access, and 5) compiling. Such a test is effective for evaluating the read/write performance of storage devices. As shown in the drawing, based on the average of the results of 10 measurements for each FTL, the address translation speed of the CFTL was approximately 13% faster than that of the NFTL and approximately 8% faster than that of the AFTL. Furthermore, when a continuity counter and a prefetching technique were used additionally, the performance of the CFTL was 17 or more % higher than that of the NFTL and 11 or more % higher than that of the AFTL due to the prediction of consecutive addresses.

Furthermore, when the size of the address translation table of the CFTL is compared with those of the NFTL and the AFTL, it can be seen that the amount of address translation table memory used is reduced. In detail, when the sizes of the address tables of the NFTL, the AFTL, and the CFTL having a sub-block factor of 8 are compared with each other, as shown in Table 2, it can be seen that the amount of address translation table memory used by the CFTL is maximally 43 or less % smaller than that of the AFTL. Meanwhile, it can be seen that when the sub-block factor of the CFTL is set to 32, the amount of memory used can be reduced by a maximum of 65%.

TABLE 2

| MFS | NFTL | AFTL | CFTL |
| --- | --- | --- | --- |
| 500 + 2,000 | 64.0 KB | 201.8 KB | 78.1 KB |
| 1,000 + 4,000 | 64.0 KB | 211.5 KB | 84.2 KB |
| 1,500 + 6,000 | 64.0 KB | 221.3 KB | 90.3 KB |
| 2,000 + 8,000 | 64.0 KB | 231.1 KB | 96.4 KB |
| 2,500 + 10,000 | 64.0 KB | 240.8 KB | 102.5 KB |
| 3,000 + 12,000 | 64.0 KB | 250.6 KB | 108.6 KB |

Meanwhile, in the present invention, when the data of a PBA is prefetched to primary memory and then address translation is performed, frequently updated data is not immediately stored in flash memory, but is stored first using a write buffer. This measure is taken to increase the lifespan of the flash memory, and is a means for minimizing repetitive write operations. In the present invention, this writing method is referred to as '2-bit write prediction.'

Figure 5:
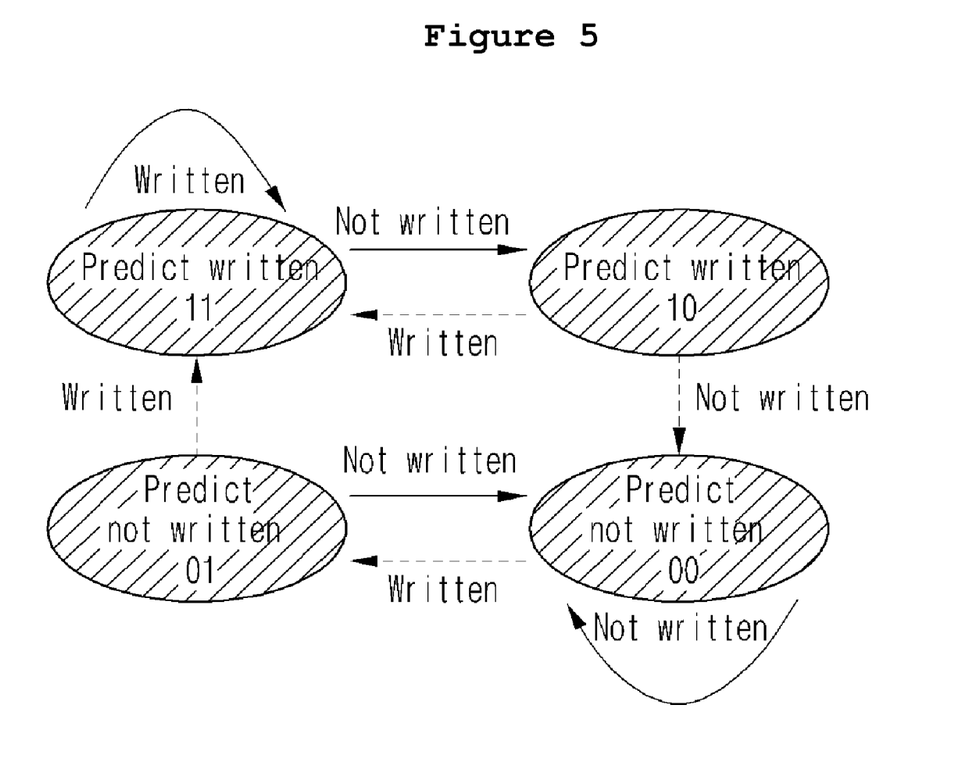
FIG. 5 is a diagram illustrating an asynchronous writing method according to an embodiment of the present invention.

The 2-bit write prediction classifies states for prediction into 4 types. FIG. 5 is a diagram illustrating an asynchronous writing method. The following description will be given with reference to this drawing.

First, a VBA including a repetitively stored LBA is added to a prediction table, and prediction bits are updated whenever a write request for the LBA which belongs to the same VBA is made. If the prediction bits are 10 and 11, a relevant VBA is determined to be a frequently updated VBA and an updated page is loaded in the reserved buffer of RAM.

When the prediction bits are changed to 00 and 01 later, only the latest data selected from among data in the reserved buffer is stored in flash memory. When the 2-bit write prediction technique is used, the prediction table is updated in the sequence of reception of write requests. Four states are represented using two bits, a VBA that is determined to be in a predict written state in which the bits are 10, 11 is stored in the reserved buffer, and, when the reserved buffer becomes full or a Predict not written state in which the prediction bits are 00, 01 is entered, only the latest data stored in the reserved buffer is merged together and is loaded in flash memory. This write delay technique can increase the lifespan of flash memory by reducing the number of writes performed on the flash memory, and is effective for maintaining the locality of data.

Figure 8:
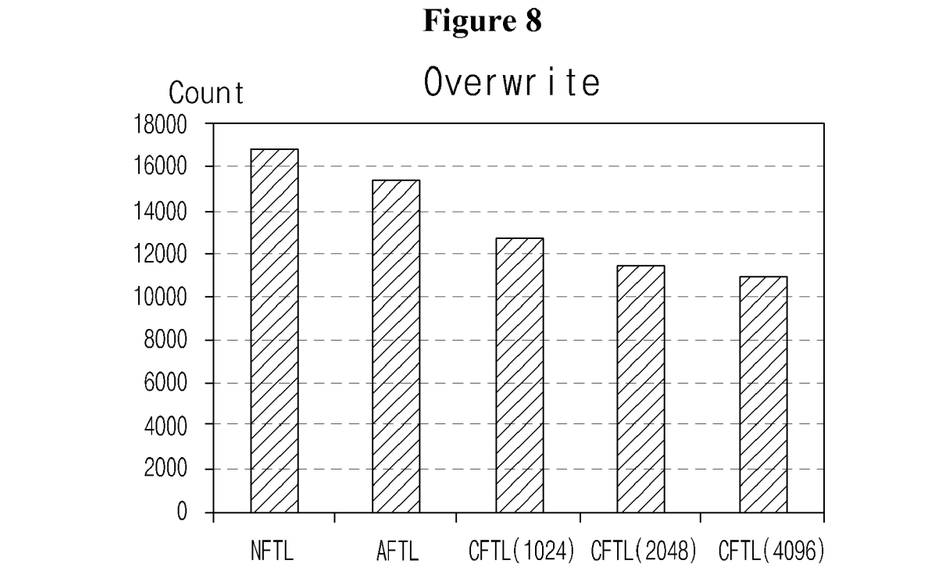
Figure 9:
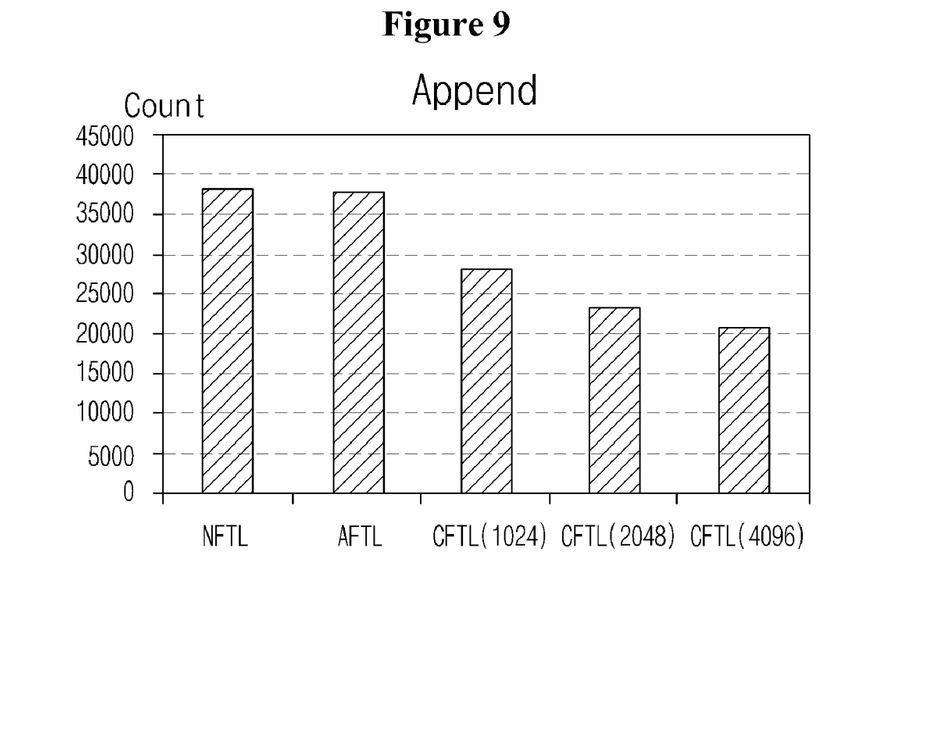
Figure 10:
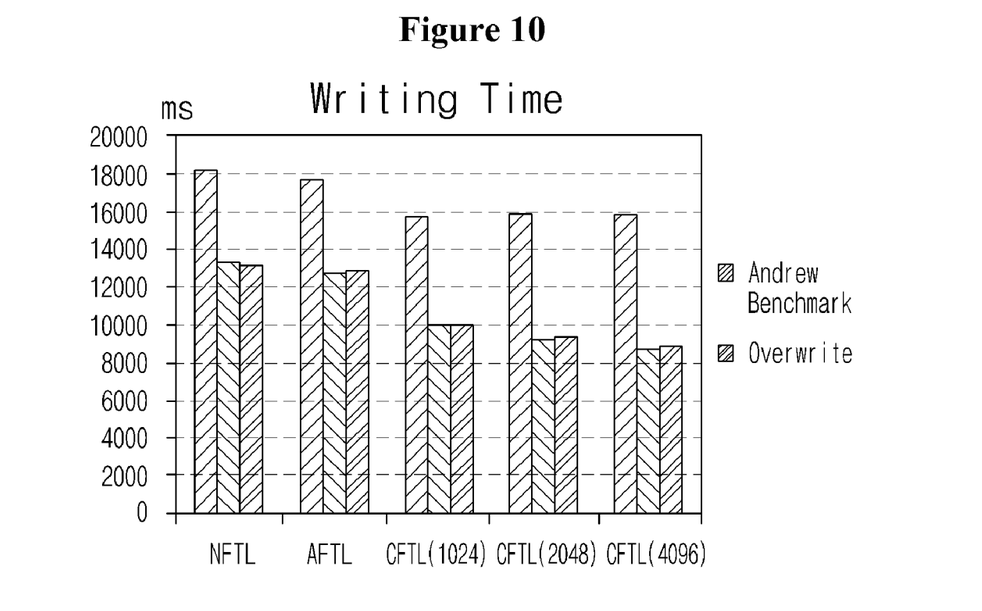

FIGS. 8 to 10 are graphs showing the lifespan of flash memory based on the above-described 2-bit write prediction technique. In the experiments according to the present invention, the reduction in the number of writes using the 2-bit write prediction technique and a write buffer is focused on. The reduction in the number of writes has the following two advantages.

First, the reduction in wear, which is a measure of the lifespan of flash memory, is accomplished. Second, the number of executions of the garbage collection technique, which is executed along with a write operation, is also reduced due to the reduction in the number of write operations. Accordingly, the 2-bit write prediction technique can improve the lifespan and performance of memory very efficiently. FIG. 8 shows the results of experiments in which the erasion and overwriting of existing files were focused on. Finally, FIG. 9 shows the results of experiments in which data was repetitively added to existing files.

It can be seen that there is little effect attributable to write in which the 2-bit write prediction technique is applied because the Andrew benchmark has various file access patterns. However, in the case of overwrite and append, the number of writes was reduced due to the use of the 2-bit write prediction technique and the reduced size of the table, and the CFTL in which the number of slots of a prediction table is 4096 had a number of writes maximally 60 or more % smaller than those of the NFTL and the AFTL.

FIG. 10 shows the write times of the existing NFTL and AFTL and the CFTL using the 2-bit write prediction technique, which were measured using the Andrew benchmark and update tests. As a result, the write time of the CFTL was about 10 or more % shorter than those of the NFTL and the AFTL in the Andrew benchmark and about 30 or more % shorter than those of the NFTL and the AFTL in the overwrite and append operation benchmarks. Furthermore, the resulting reduction proves that the CFTL can be used to reduce the overhead of the garbage collection technique.

Here, the amounts of memory used in the 2-bit write prediction technique according to the present invention are described below. As shown in Table 3, the numbers of slots of prediction tables were 1024, 2048, and 4096, respectively, the sizes of the tables were 8 KB, 16 KB, and 32 KB, respectively, and the amounts of memory used by the write buffers were 512 KB, 1 MB, and 2 MB, respectively.

TABLE 3

| Number of slots | Amount of use of memory | Size of write buffer |
|---|---|---|
| 1024 | 8 KB | 512 KB |
| 2048 | 16 KB | 1 MB |
| 4096 | 32 KB | 2 MB |

As a result, it is proved that through the asynchronous write technique using the 2-bit write prediction technique according to the present invention, the address translation performance of the prefetching and the asynchronous write technique was about 17% higher than that of an existing NFTL, and the write performance thereof was about 30 or more % than that of the existing NFTL.

According to the present invention constructed as described above, since a multi-stage clustered hash table is employed, there is an advantage in that the size of the address translation table is not only minimized but also the performance of address translation is maximized.

Furthermore, since consecutive addresses are prefetched and then address translation is performed, there is an advantage in that the efficiency of address translation can be increased.

Furthermore, since the data of frequently updated addresses is temporarily stored in the buffer and is then written to the flash memory collectively, there is an advantage in that the wear of the flash memory can be leveled.

Furthermore, since the address data of each clustered hash table is migrated using a 2-bit bit vector, there is an advantage in that the performance of address translation is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flash file system, comprising:
a file system;
a Flash Translation Layer (FTL) for receiving Local Block Addresses (LBAs) from the file system, and translating the LBAs into Physical Block Address (PBAs); and
flash memory for receiving the resulting PBAs;
wherein the FTL includes a memory block in which a multi-stage clustered hash table for mapping the LBAs to the PBAs is stored, and performs the address translation using the multi-stage clustered hash table,
wherein the multi-stage clustered hash table stored in the memory block comprises a first clustered hash table and a second clustered hash table of a page translation type and a third clustered hash table of a block translation type, each of the clustered hash tables including buckets into each of which a predetermined number of pieces of consecutive address data is grouped,
wherein each of the LBAs recorded in each of the first clustered hash table and the second clustered hash table includes a bit vector that includes a reference bit and a modification bit respectively indicative of reference and modification of the LBA, and
wherein address data recorded in each of the clustered hash tables is migrated from the first clustered hash table to the second clustered hash table and from the second clustered hash table to the third clustered hash table on a basis of the bit vectors.

2. The flash file system as set forth in claim 1, wherein:
each of the page translation-type clustered hash tables includes buckets into each of which a predetermined number of consecutive LBAs is grouped; and
the block translation-type clustered hash table includes buckets into each of which a predetermined number of consecutive sub-blocks is grouped.

3. The flash file system as set forth in claim 1, wherein the block translation-type clustered hash table includes continuity counters, each indicative of a number of consecutive sub-blocks, along with PBAs of the sub-blocks.

4. The flash file system as set forth in claim 1, wherein if the entered LBA exists in the multi-stage clustered hash table, the FTL prefetches an entire bucket including the LBA to the memory block and then performs the address translation.

5. The flash file system as set forth in claim 1, wherein:
each memory block includes a buffer; and
if 2 bit write prediction at an address is updated by requested a write operation and 2 bit write prediction is 11 or 10, data stored in the flash memory at the address is temporarily stored in a buffer; if the buffer becomes full or the reference bit is changed to 00 or 01, data stored in the buffer is collectively written to the flash memory.

6. The flash file system as set forth in claim 1, wherein: each of the LBAs recorded in the multi-stage clustered hash table includes data of a hit count in which a number of uses of the LBA is recorded; and
a hit count of address data stored in each of the clustered hash tables is compared with a preset threshold value, and the address data is migrated based on a result of the comparison.

7. An address translation method using a Clustered Flash Translation Layer (CFTL), comprising the steps of:
(a) searching a page translation-type first clustered hash table for an LBA, translation of which has been requested;
(b) determining whether data corresponding to the LBA exists in the first clustered hash table, and, if the data exists, translating the LBA into a PBA;
(c) If, as a result of the determination at step (b), the data of the LBA does not exist, determination whether the data of the LBA exists in a page translation-type second clustered hash table, and, if the data exists, translating the LBA into a PBA; and
(d) if, as a result of the determination at step (c), the data of the LBA does not exist, translating the LBA into a PBA using a block translation-type third clustered hash table.

8. The address translation method as set forth in claim 7, wherein data of each address recorded in the third clustered hash table includes a hit count in which a number of uses of the address is recorded;
further comprising, after step (d), step (e) of, if the hit count exceeds a first preset threshold value, migrating the data of the address from the third clustered hash table to the second clustered hash table.

9. The address translation method as set forth in claim 7, wherein data of each address recorded in the second clustered hash table includes a hit count in which a number of uses of the address is recorded;
further comprising, after step (d), step (f) of, if the hit count exceeds a second preset threshold value, migrating the data of the address from the second clustered hash table to the first clustered hash table.

10. The address translation method as set forth in claim 7, further comprising, after step (d), step (g) of migrating data of each address recorded in the first clustered hash table or the second clustered hash table, from the first clustered hash table or the second clustered hash table to the third clustered hash table using a bit vector including a reference bit indicative of reference of the address and a modification bit indicative of modification of the address.

11. The address translation method as set forth in claim 7, wherein each of the clustered hash tables includes buckets into each of which a predetermined number of consecutive sub-blocks, including data of the LBAs, is grouped.

12. The address translation method as set forth in claim 11, wherein the third clustered hash table includes continuity counters, each indicative of a number of consecutive sub-blocks, along with PBAs of the sub-blocks.

13. The address translation method as set forth in claim 11, wherein if the LBA, the translation of which has been requested, exists in the clustered hash table, the address translation is performed after an entire bucket including the LBA has been prefetched to a memory block.

* * * * *